(12) United States Patent
Lee

(10) Patent No.: US 6,670,250 B2
(45) Date of Patent: Dec. 30, 2003

(54) MOS TRANSISTOR AND METHOD FOR FORMING THE SAME

(75) Inventor: Dong-hun Lee, Anyang (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 10/080,077

(22) Filed: Feb. 21, 2002

(65) Prior Publication Data

US 2003/0015739 A1 Jan. 23, 2003

(30) Foreign Application Priority Data

Jul. 19, 2001 (KR) ........................................ 2001-43506

(51) Int. Cl.[7] .............................................. H01L 21/336
(52) U.S. Cl. ........................ 438/301; 438/303; 438/305; 438/231; 438/528; 438/595
(58) Field of Search ................................. 438/301, 303, 438/305, 231, 528, 595

(56) References Cited

U.S. PATENT DOCUMENTS

| | | | |
|---|---|---|---|
| 5,656,523 A | * 8/1997 | Wilhoit | 438/303 |
| 5,811,342 A | * 9/1998 | Wu | 438/303 |
| 6,093,594 A | * 7/2000 | Yeap et al. | 438/231 |
| 6,361,874 B1 | * 3/2002 | Yu | 438/514 |

* cited by examiner

Primary Examiner—Amir Zarabian
Assistant Examiner—Toniae M. Thomas
(74) Attorney, Agent, or Firm—Mills & Onello LLP

(57) ABSTRACT

A MOS transistor including a gate poly oxide layer formed to have different thicknesses over the entire surface of a semiconductor substrate and a method for forming the MOS transistor are provided. A gate oxide layer pattern and a gate conductive layer pattern are formed on a semiconductor substrate. A mask layer pattern is formed on the semiconductor substrate and the gate conductive layer pattern so that the gate conductive layer pattern is completely covered with the mask layer pattern. The semiconductor substrate is made to be amorphous using the mask layer pattern. The mask layer pattern is removed and then a gate poly oxide layer is deposited over the entire surface of the semiconductor substrate. A gate spacer layer is deposited on the gate poly oxide layer and gate spacers are formed by anisotropically etching the gate spacer layer and the gate poly oxide layer. A source/drain region is formed on the semiconductor substrate. Accordingly, it is possible to prevent damage to the semiconductor substrate, such as pitting of the semiconductor substrate, and reduce an increase in junction leakage current introduced by the occurrence of pitting. In addition, it is possible to thinly form a junction region and improve the performance of the MOS transistor.

15 Claims, 7 Drawing Sheets

MOS TRANSISTOR AND METHOD FOR FORMING THE SAME

BACKGROUND OF THE INVENTION

1. Field of the Invention

The present invention relates to a MOS transistor and a method for forming the MOS transistor, and more particularly, to a MOS transistor in which a gate poly oxide layer is formed to a predetermined thickness on a semiconductor substrate and a method for forming the MOS transistor

2. Description of the Related Art

As the integration density and storage capacity of semiconductor devices increase, the size of MOS transistors continues to decrease. Accordingly, the thicknesses of a gate oxide layer and a gate poly oxide layer and the depth of a junction region, such as a source/drain region, decrease.

FIGS. 1 through 4 are cross-sectional views illustrating a conventional method for manufacturing a MOS transistor. Referring to FIG. 1, a gate oxide layer pattern 30 and a gate conductive layer pattern 35 are sequentially formed on a semiconductor substrate 10 in which a shallow trench isolation (STI) 20 is formed.

Next, as shown in FIG. 2, a gate poly oxide layer 40 is formed over the entire surface of the semiconductor substrate 10, and a source/drain region 45 is formed on the semiconductor substrate 10. As the size of a MOS transistor decreases, the thickness of the gate poly oxide layer 40 continues to decrease. However, if the thickness of the gate poly oxide layer 40 is too small, the characteristics of the gate poly oxide layer may be degraded, the semiconductor substrate 10 may be damaged, pitting of the substrate may occur, and junction leakage current may increase.

As shown in FIG. 3, a middle temperature oxide (MTO) layer 50 and a spacer layer 60 are sequentially deposited on the gate poly oxide layer 40. The MTO layer 50 is introduced for obtaining etching margins required in forming gate spacers. As the thickness of the MTO layer 50 increases, a greater etching margin is ensured. However, since the size of a MOS transistor increases in accordance with an increase in the thickness of the MTO layer 50, there is a limit to how thick the MTO layer 50 can be. Next, the spacer layer 60, the MTO layer 50, and the gate poly oxide layer 40 are anisotropically etched, thereby forming gate spacers.

However, as shown in FIG. 4, in a MOS transistor formed through such a method, pitting 70 occurs on the surface of the semiconductor substrate 10. This is because the gate poly oxide layer 40 and the MTO layer 50 are formed too thin due to the decrease in the size of the MOS transistor and thus the gate poly oxide layer 40 and the MTO layer 50 cannot perform their functions well. In particular, since the gate poly oxide layer 40 directly contacting the semiconductor substrate 10 is thinly formed, it is difficult to maintain a sufficient etching selection ratio of the gate poly oxide layer 40 with respect to the spacer layer 60 during the anisotropic etching for forming the gate spacers, and thus the semiconductor substrate 10 is prone to be damaged by the anisotropic etching. As a result, pitting 70 occurs on the surface of the semiconductor substrate 10 so that an increase in junction leakage current may be caused and a whole device may be defective.

SUMMARY OF THE INVENTION

To solve the above-described problems, it is a first object of the present invention to provide a method for forming a MOS transistor which is capable of preventing damage to a semiconductor substrate and junction leakage current caused by etching to form spacers.

It is a second object of the present invention to provide a MOS transistor formed through such a method.

According to a first aspect of the invention, there is provided a method for forming a MOS transistor. A gate oxide layer pattern and a gate conductive layer pattern are formed on a semiconductor substrate. A mask layer pattern is formed on the semiconductor substrate and the gate conductive layer pattern so that the gate conductive layer pattern is completely covered with the mask layer pattern. The semiconductor substrate is made to be amorphous using the mask layer pattern. The mask layer pattern is removed, and a gate poly oxide layer is deposited over the entire surface of the semiconductor substrate. A gate spacer layer is deposited on the gate poly oxide layer and gate spacers are formed by anisotropically etching the gate spacer layer and the gate poly oxide layer. A source/drain region is formed on the semiconductor substrate.

Preferably, the sidewall of the gate conductive layer pattern is isolated from the sidewall of the mask layer pattern by 60–140 Å.

Preferably, the step of making the semiconductor substrate amorphous is performed by implanting Si or Ge ions into portions of the semiconductor substrate using the mask layer pattern as an ion implantation mask.

Preferably, the gate poly oxide layer is grown to have different thicknesses including a first thickness and a second thickness. The second thickness is greater than the first thickness. Preferably, the gate poly oxide layer formed to have the second thickness is positioned on only the portions of the semiconductor substrate that have been made to be amorphous.

Preferably, the first thickness of the gate poly oxide layer is 10–50 Å.

Preferably, the second thickness of the gate poly oxide layer is six times greater than the first thickness of the gate poly oxide layer.

Preferably, a middle temperature oxide (MTO) layer is further formed on the gate poly oxide layer after depositing the gate poly oxide layer over the entire surface of the semiconductor substrate.

In accordance with another aspect of the invention, there is provided another method for forming a MOS transistor. A gate oxide layer pattern and a gate conductive layer pattern are formed on a semiconductor substrate. A mask layer pattern is formed to have a size larger than the gate conductive layer pattern on the gate conductive layer pattern. The semiconductor substrate is made to be amorphous using the mask layer pattern. The mask layer pattern is removed, and a gate poly oxide layer is deposited over the entire surface of the semiconductor substrate. A gate spacer layer is deposited on the gate poly oxide layer and gate spacers are formed by anisotropically etching the gate spacer layer and the gate poly oxide layer. A source/drain region is formed on the semiconductor substrate.

Preferably, the step of forming the mask layer pattern includes forming an anti-reflection coating (ARC) layer on the gate conductive layer pattern, and patterning the gate oxide layer pattern and the gate conductive layer pattern by skew-etching so that the gate oxide layer pattern and the gate conductive layer pattern have a size smaller than the top surface of the ARC layer pattern.

Preferably, the step of making the semiconductor substrate amorphous is performed by implanting Si or Ge ions into portions of the semiconductor substrate using the mask layer pattern as an ion implantation mask.

Preferably, the gate poly oxide layer is grown to have different thicknesses including a first thickness and a second thickness. The second thickness is greater than the first thickness.

Preferably, a middle temperature oxide (MTO) layer is further formed on the gate poly oxide layer after the step of removing the mask layer pattern and depositing the gate poly oxide layer.

In accordance with another aspect of the invention, there is provided a MOS transistor. The transistor includes a gate oxide layer pattern and a gate conductive layer pattern formed on a semiconductor substrate, a gate spacer layer formed at the sidewalls of the gate conductive layer pattern. A gate poly oxide layer is formed to have different thicknesses including a first thickness and a second thickness between the semiconductor substrate and the bottom of the gate spacer layer. A source/drain region is formed on the semiconductor substrate.

Preferably, the second thickness is the thickness of the gate poly oxide layer at the sidewall of the gate spacer layer. Preferably, the second thickness of the gate poly oxide layer is greater than the first thickness of the gate poly oxide layer.

According to the present invention, it is possible to thickly form a gate poly oxide layer on a semiconductor substrate that is made to be amorphous by making exposed portions of the semiconductor substrate amorphous during a process of etching gate spacers. Accordingly, it is possible to prevent damage to the semiconductor substrate, such as pitting of the semiconductor substrate, and reduce an increase in junction leakage introduced by the occurrence of pitting. In addition, it is possible to thinly form a junction region by implantation of ions having a low energy, and thus the performance of a MOS transistor can be improved.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 12 is a cross-sectional view illustrating the structure of a MOS transistor formed by the method for forming a MOS transistor according to the first embodiment of the present invention.

DETAILED DESCRIPTION OF THE INVENTION

Figure 1:
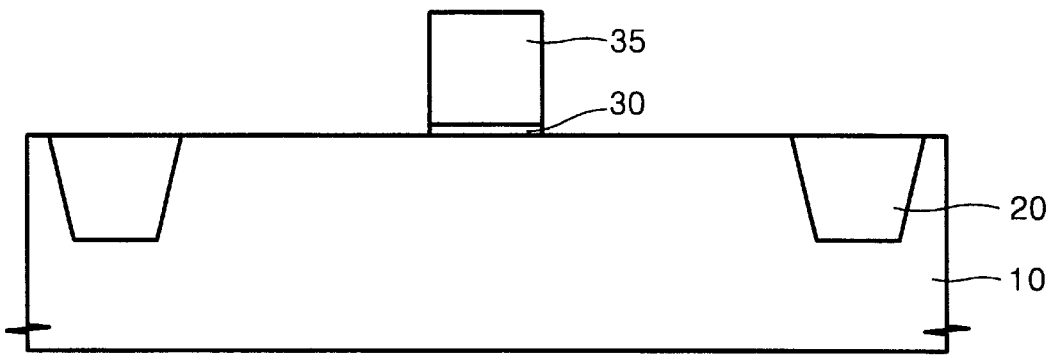
FIGS. 1 through 4 are cross-sectional views illustrating a conventional method for forming a MOS transistor.
Figure 2:
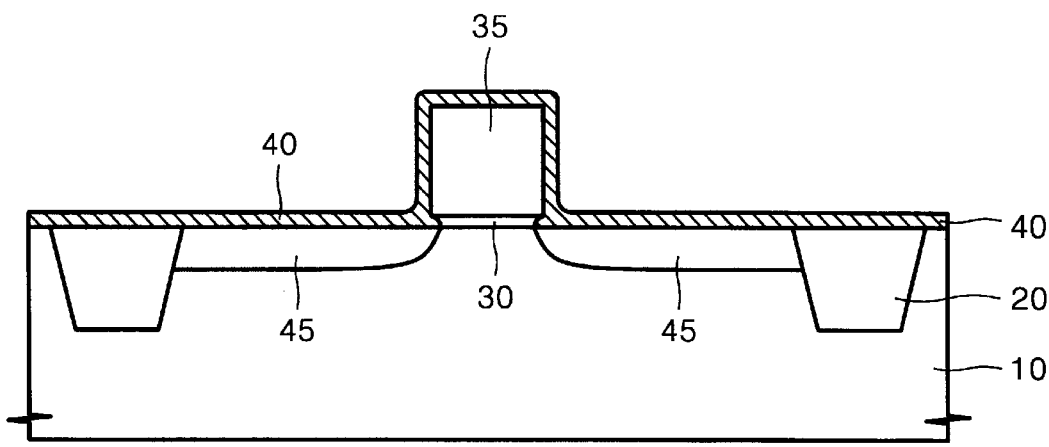
Figure 3:
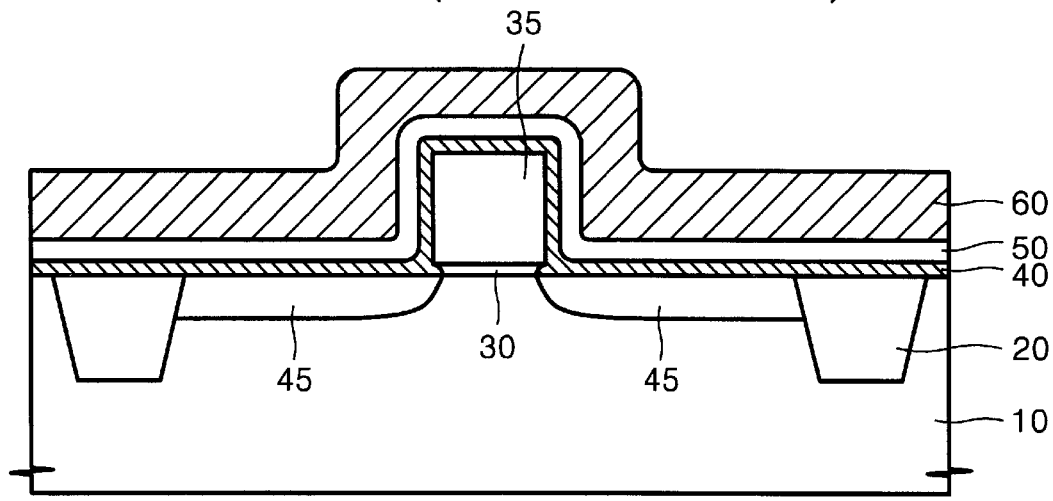
Figure 4:
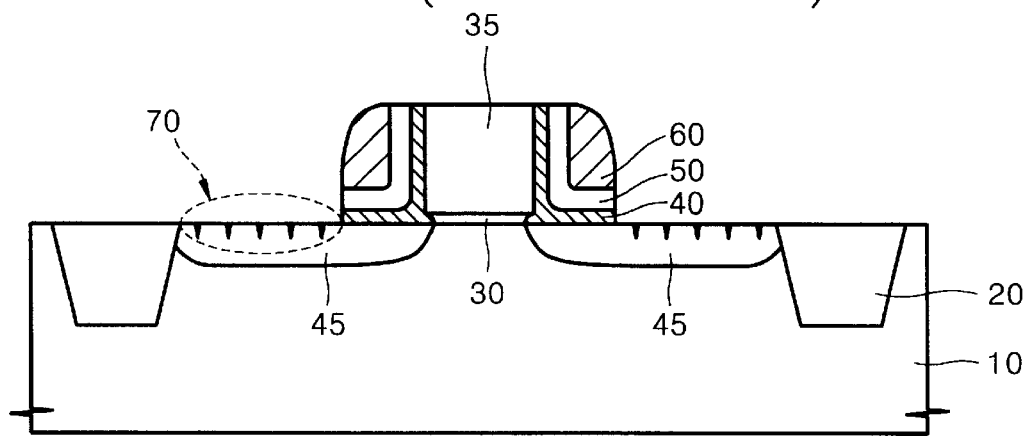

In the drawings, the thickness of layers and regions are exaggerated for clarity.

Figure 10:
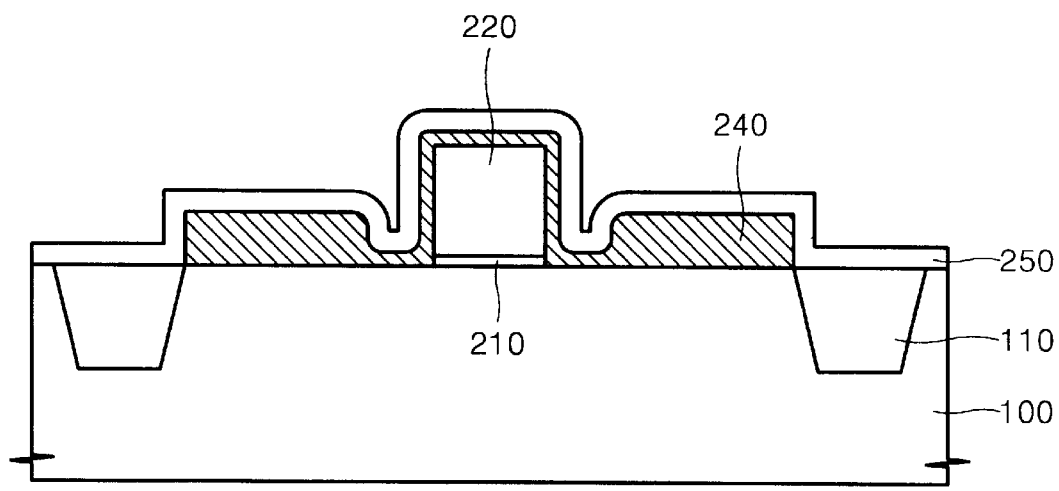
Figure 11:
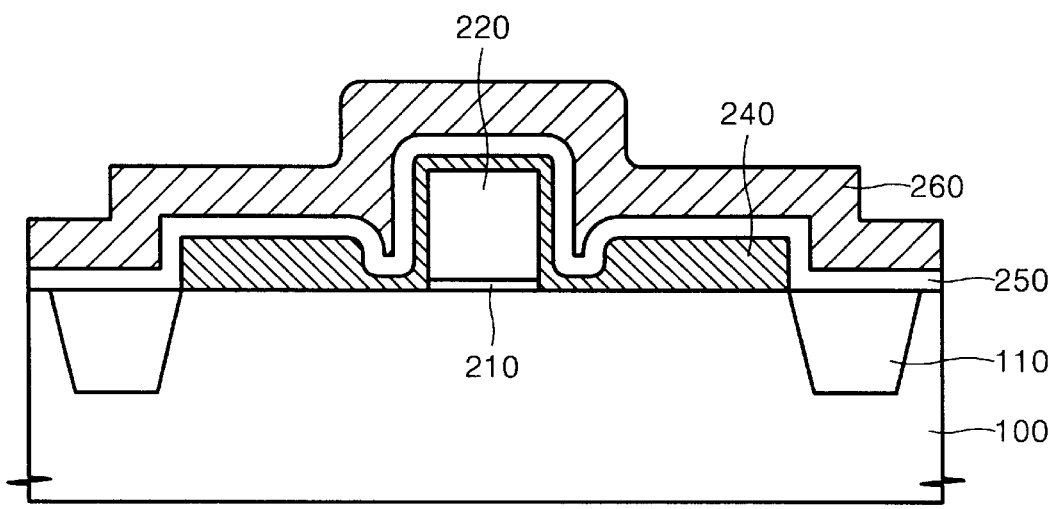
Figure 12:
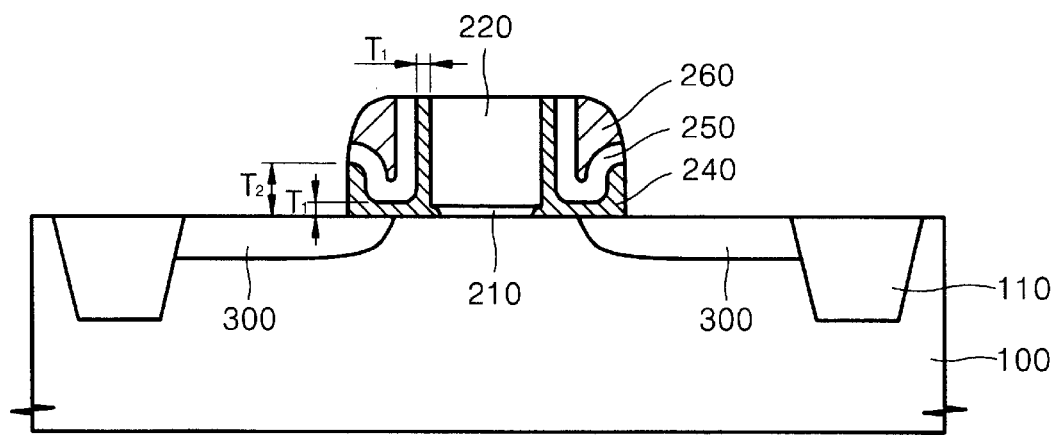

FIGS. 5 through 12 are cross-sectional views illustrating a method for forming a MOS transistor according to a first embodiment of the present invention, and in particular, FIG. 12 is a cross-sectional view illustrating the structure of a MOS transistor formed through the method for forming a MOS transistor according to the first embodiment of the present invention. A method for forming a MOS transistor will be described first with reference to FIGS. 5 through 12, and then the structure of the MOS transistor will be described with reference to FIG. 12.

Figure 5:
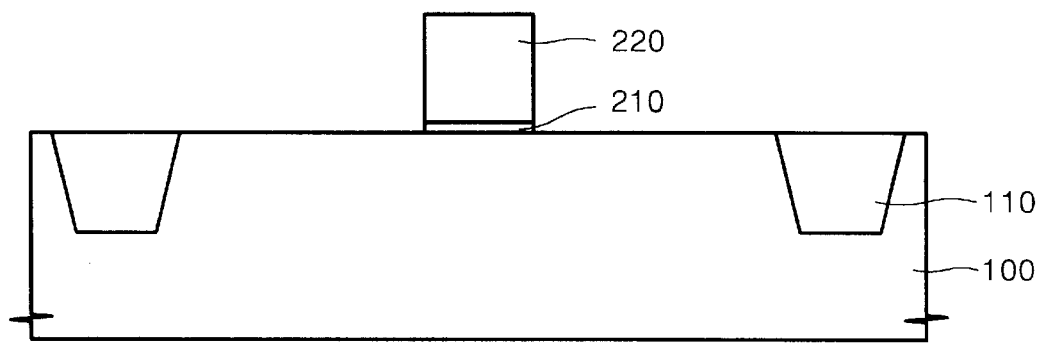
FIGS. 5 through 12 are cross-sectional views illustrating a method for forming a MOS transistor according to a first embodiment of the present invention.

FIG. 5 is a cross-sectional view illustrating a step of forming a gate oxide layer pattern and a gate conductive layer pattern. Referring to FIG. 5, a gate oxide layer pattern 210 and a gate conductive layer pattern 220 are formed on a semiconductor substrate 100 in which a shallow trench isolation (STI) 110 is formed.

Figure 6:
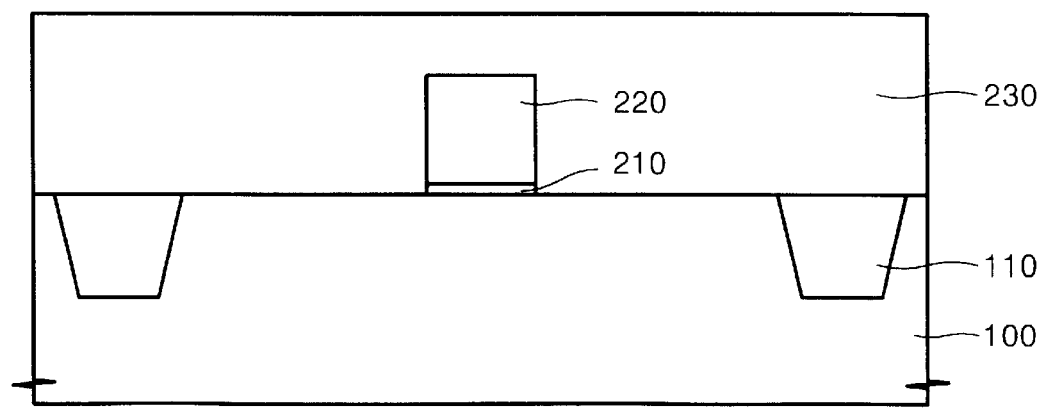
Figure 7:
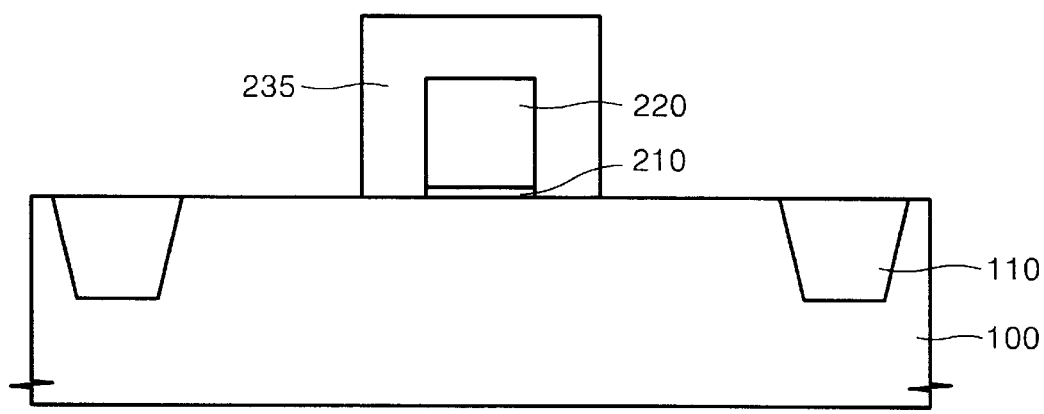

Next, as shown in FIGS. 6 and 7, a mask layer pattern 235 is formed on predetermined portions of the semiconductor substrate 100 and the gate conductive layer pattern 220. FIG. 6 is a cross-sectional view illustrating a step of depositing a photoresist layer 230 over the entire surface of the semiconductor substrate 100 so that the gate oxide layer pattern 210 and the gate conductive layer pattern 220 are completely covered with the photoresist layer 230. The photoresist layer 230 is used to form the mask layer pattern 235. Next, the photoresist layer 230 is patterned, thereby forming the mask layer pattern 235, as shown in FIG. 7. The mask layer pattern 235 is formed to have a size larger than the gate conductive layer pattern so that the mask layer pattern 235 completely covers the gate conductive layer pattern 220. Preferably, the mask layer pattern 235 may be a photoresist layer pattern. Preferably, the distance M between the sidewalls of the gate conductive layer pattern 220 and the mask layer pattern 235 is 60–140 Å (see FIG. 8).

Figure 8:
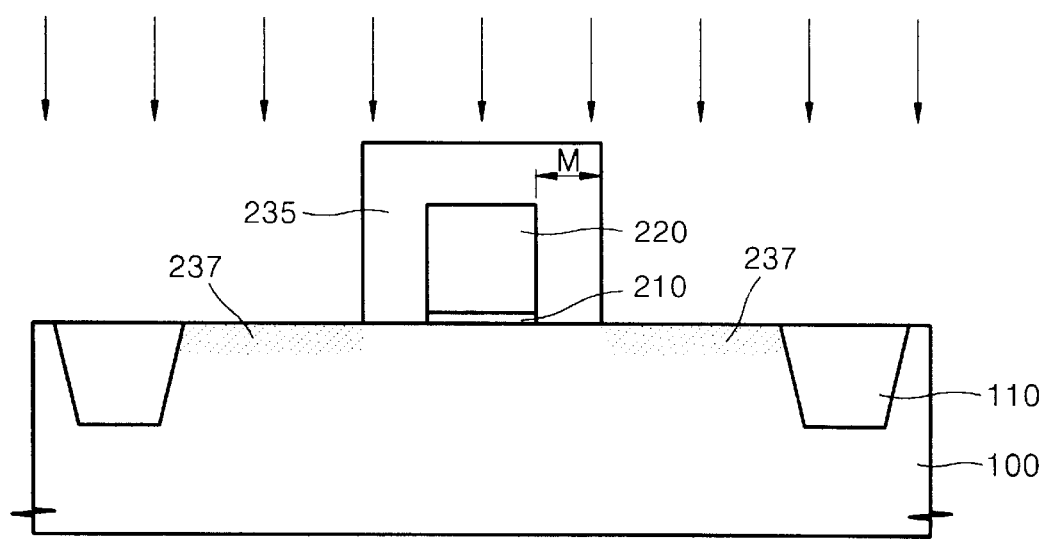

FIG. 8 is a cross-sectional view illustrating a step of making the semiconductor substrate 100 amorphous using the mask layer pattern 235 as an ion implantation mask. Referring to FIG. 8, a predetermined portion 237 of the semiconductor substrate 100 is made to be amorphous by implanting Si or Ge ions into the predetermined portion 237 of the semiconductor substrate 100. That is, Si or Ge ions are implanted into the entire surface of the semiconductor substrate 100 except a portion of the semiconductor substrate 100 under the mask layer pattern 235.

Figure 9:
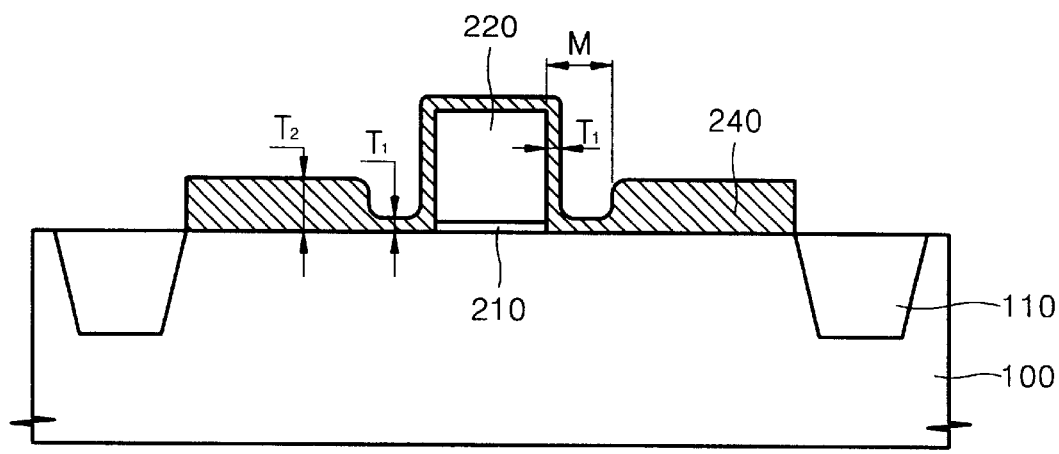

Next, the mask layer pattern 235 is removed, and then, as shown in FIG. 9, a gate poly oxide layer 240 is grown over the entire surface of the semiconductor substrate 100. The gate poly oxide layer 240 is formed such that the thickness of the gate poly oxide layer 240 varies at different portions of the semiconductor substrate 100. That is, the gate poly oxide layer 240 is formed to a first thickness T1 over portions of the semiconductor substrate 100 that have not been made to be amorphous and over the gate conductive layer pattern 220, and is formed to a second thickness T2 over other portions of the semiconductor substrate that have been made to be amorphous. Preferably, the first thickness T1 is 10–50 Å. Preferably, the second thickness T2 is six times greater than the first thickness T1.

Next, as shown in FIG. 10, a middle temperature oxide (MTO) layer 250 is deposited on the gate poly oxide layer 240. The MTO layer 250 is introduced to obtain an etching margin required in the formation of gate spacers. As the thickness of the MTO layer 250 increases, a greater etching margin is obtained. However, if the MTO layer 250 is too thick, the size of a transistor increases, and thus there is a limit in increasing the thickness of the MTO layer 250.

Next, as shown in FIG. 11, a gate spacer layer 260 is deposited on the MTO layer 250. The gate spacer layer 260 is preferably formed of a nitride layer or an oxide layer. Next, the gate spacer layer 260, the MTO layer 250, and the gate poly oxide layer 240 are anisotropically etched, thereby forming gate spacers. During the anisotropic etching, damage to the semiconductor substrate does not occur. That is, since the gate poly oxide layer 240 formed to the second thickness T2 on the semiconductor substrate 100 is sufficiently thick, the semiconductor substrate 100 is protected from the anisotropic etching so that pitting can be prevented from occurring on the semiconductor substrate. If the gate poly oxide layer 240 formed on the portions of the semiconductor substrate 100 that has not been made to be amorphous is no greater than 30 Å, it is possible to more efficiently protect the semiconductor substrate 100 and completely prevent pitting from occurring.

Next, as shown in FIG. 12, a source/drain region 300 is formed in the semiconductor substrate 100.

FIG. 12 is a cross-sectional view illustrating the structure of a MOS transistor formed through the method for forming a MOS transistor according to the first embodiment of the present invention. Referring to FIG. 12, the MOS transistor includes the gate oxide layer pattern 210, the gate conductive layer pattern 220, the gate spacer layer 260 formed at the sidewalls of the gate conductive layer pattern 220, the gate poly oxide layer 240 formed to have different thicknesses, that is, the first and second thicknesses T1 and T2, at different portions of the semiconductor substrate 100, the MTO layer 250 interposed between the gate poly oxide layer 240 and the gate spacer layer 260, and the source/drain region formed on the semiconductor substrate 100.

The second thickness T2 indicates the thickness of the gate poly oxide layer at the sidewall of the gate spacer layer 260. As the second thickness T2 of the gate poly oxide layer 240 formed between the gate spacer layer 260 and the semiconductor substrate 100 increases, it becomes easier to prevent damage to the semiconductor substrate 100 caused by etching for forming gate spacers. The second thickness T2 of the gate poly oxide layer 240 is preferably greater than the first thickness T1 of the gate poly oxide layer 240. The second thickness T2 of the gate poly oxide layer 240 is preferably six times greater than the first thickness T1 of the gate poly oxide layer 240. The gate spacer layer 260 is preferably formed of a nitride layer or an oxide layer.

Figure 13:
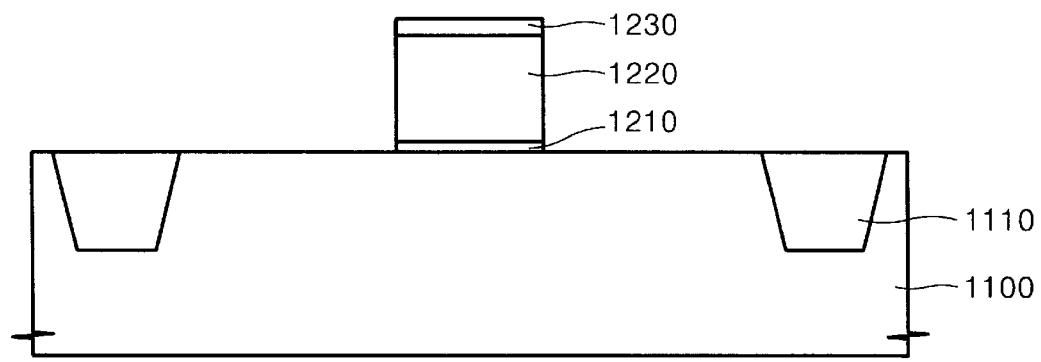
FIGS. 13 through 15 are cross-sectional views illustrating a method for forming a MOS transistor according to a second embodiment of the present invention.
Figure 14:
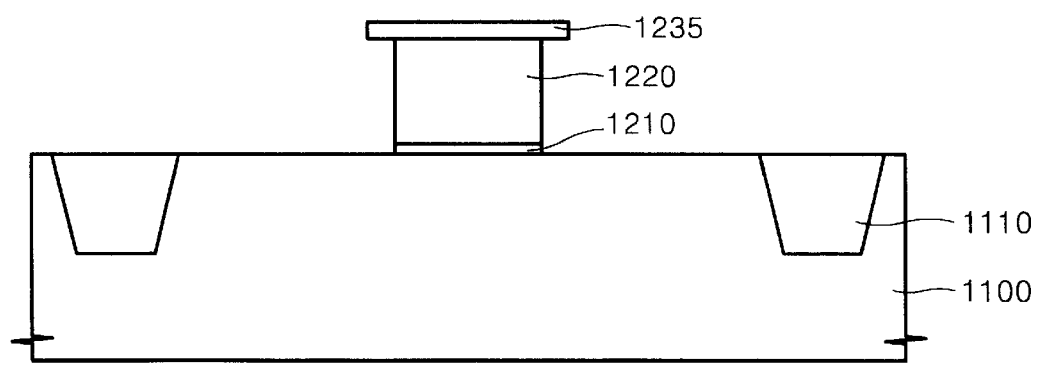
Figure 15:
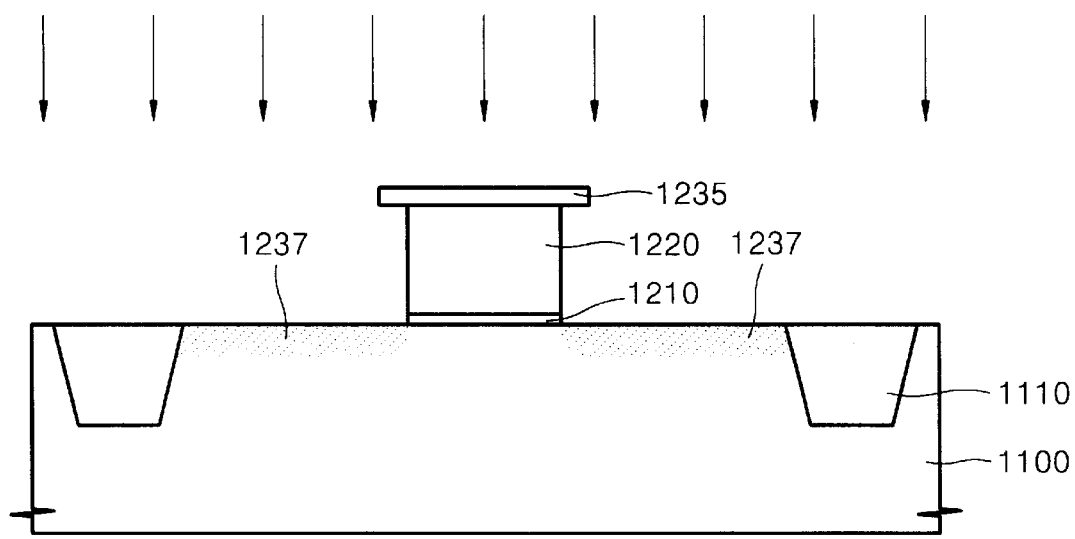

FIGS. 13 through 15 are cross-sectional views illustrating a method for forming a MOS transistor according to a second embodiment of the present invention. The present embodiment is the same as the previous embodiment except for a step of forming a mask layer pattern used to make a predetermined portion of a semiconductor substrate amorphous.

FIG. 13 is a cross-sectional view illustrating a step of forming a gate oxide layer pattern 1210, a gate conductive layer pattern 1220, and an anti-reflection coating (ARC) layer 1230. Referring to FIG. 13, the gate oxide layer pattern 1210, the gate conductive layer pattern 1220, and the ARC layer 1230 are formed on a semiconductor substrate 1100 in which a shallow trench isolation (STI) 1110 is formed.

Next, as shown in FIG. 14, the gate oxide layer pattern 1210 and the gate conductive layer pattern 1220 are skew-etched, thereby forming a mask layer pattern 1235. The sidewalls of the gate oxide layer pattern 1210 and the gate conductive layer pattern 1220 are etched so that the mask layer pattern 1235 completely covers the top surface of the gate conductive layer pattern 1220. Preferably, the sidewall of the gate conductive layer pattern 1220 is isolated from the sidewall of the mask layer pattern 1235 by 60–140 Å.

FIG. 15 is a cross-sectional view illustrating a step of making predetermined portions of the semiconductor substrate 1100 amorphous using the mask layer pattern 1235 as an ion implantation mask. Referring to FIG. 15, the predetermined portions of the semiconductor substrate 1100 are made to be amorphous by implanting Si or Ge ions into the predetermined portions of the semiconductor substrate 1100. Next, the mask layer pattern 1235 is removed.

Next, processes subsequent to the removal of the mask layer pattern 1235 are the same as those of the first embodiment of the present invention. In other words, the step of depositing the gate poly oxide layer 240 shown in FIG. 9 through the step of forming the source/drain region 300 shown in FIG. 12 can be directly applied to the second embodiment of the present invention.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a MOS transistor comprising:
   (a) forming a gate oxide layer pattern and a gate conductive layer pattern on a semiconductor substrate;
   (b) forming a mask layer pattern on the semiconductor substrate and the gate conductive layer pattern so that the gate conductive layer pattern is completely covered with the mask layer pattern;
   (c) making a first region of the semiconductor substrate amorphous using the mask layer pattern such that a second region of the semiconductor substrate is not made amorphous;
   (d) removing the mask layer pattern and forming a gate poly oxide layer over the entire surface of the semiconductor substrate, the gate poly oxide layer having a first thickness at the second region of the semiconductor substrate and a second thickness at the first region of the semiconductor substrate, the first and second thicknesses being different;
   (e) depositing a gate spacer layer on the gate poly oxide layer and forming gate spacers by anisotropically etching the gate spacer layer and the gate poly oxide layer; and
   (f) forming a source/drain region on the semiconductor substrate.

2. The method of claim 1, wherein the sidewall of the gate conductive layer pattern is isolated from the sidewall of the mask layer pattern by 60–140 Å.

3. The method of claim 1, wherein the mask layer pattern is a photoresist pattern.

4. The method of claim 1, wherein step (c) is performed by implanting at least one of Si and Ge ions into portions of the semiconductor substrate using the mask layer pattern as an ion implantation mask.

5. The method of claim 1, wherein the first thickness of the gate poly oxide layer is 10–50 Å.

6. The method of claim 1, wherein the second thickness of the gate poly oxide layer is six times greater than the first thickness of the gate poly oxide layer.

7. The method of claim 1 further comprising forming a middle temperature oxide (MTO) layer on the gate poly oxide layer after step (d).

8. The method of claim 1, wherein the gate spacer layer is formed of a nitride layer or an oxide layer.

9. A method for forming a MOS transistor comprising:

(a) forming a gate oxide layer pattern and a gate conductive layer pattern on a semiconductor substrate;

(b) forming a mask layer pattern to have a size larger than the gate conductive layer pattern on the gate conductive layer pattern;

(c) making a first region of the semiconductor substrate amorphous using the mask layer pattern such that a second region of the semiconductor substrate is not made amorphous;

(d) removing the mask layer pattern and forming a gate poly oxide layer over the entire surface of the semiconductor substrate, the gate poly oxide layer having a first thickness at the second region of the semiconductor substrate and a second thickness at the first region of the semiconductor substrate, the first and second thicknesses being different;

(e) depositing a gate spacer layer on the gate poly oxide layer and forming gate spacers by anisotropically etching the gate spacer layer and the gate poly oxide layer; and (f) forming a source/drain region on the semiconductor substrate.

10. The method of claim 9, wherein the sidewall of the gate conductive layer pattern is isolated from the sidewall of the mask layer pattern by 60–140 Å.

11. The method of claim 9, wherein step (b) comprises:

forming an anti-reflection coating (ARC) layer on the gate conductive layer pattern; and patterning the gate oxide layer pattern and the gate conductive layer pattern by skew-etching so that the gate oxide layer pattern and the gate conductive layer pattern have a size smaller than the top surface of the ARC layer pattern.

12. The method of claim 13, wherein step (c) is performed by implanting at least one of Si and Ge ions into portions of the semiconductor substrate using the mask layer pattern as an ion implantation mask.

13. The method of claim 9, wherein the first thickness of the gate poly oxide layer is 10–50 Å.

14. The method of claim 9, wherein the second thickness of the gate poly oxide layer is 2 to 6 times greater than the first thickness of the of the gate poly oxide layer.

15. The method of claim 13 further comprising forming a middle temperature oxide (MTO) layer on the gate poly oxide layer after step (d).

* * * * *

UNITED STATES PATENT AND TRADEMARK OFFICE
CERTIFICATE OF CORRECTION

PATENT NO. : 6,670,250 B2 Page 1 of 1
DATED : December 30, 2003
INVENTOR(S) : Dong-hun Lee It is certified that error appears in the above-identified patent and that said Letters Patent is hereby corrected as shown below:

Column 8,
Lines 12 and 21, delete "13" and insert -- 9 --.

Signed and Sealed this

Sixth Day of April, 2004

JON W. DUDAS
*Acting Director of the United States Patent and Trademark Office*